(12) United States Patent
Kim

(10) Patent No.: US 8,912,586 B2
(45) Date of Patent: Dec. 16, 2014

(54) SEMICONDUCTOR DEVICE AND METHOD FOR MANUFACTURING THE SAME

(75) Inventor: Chan Woo Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 219 days.

(21) Appl. No.: 13/347,025

(22) Filed: Jan. 10, 2012

(65) Prior Publication Data

US 2013/0001744 A1  Jan. 3, 2013

(30) Foreign Application Priority Data

Jul. 1, 2011  (KR) .................. 10-2011-0065682

(51) Int. Cl.
*H01L 27/108* (2006.01)
*H01L 23/522* (2006.01)

(52) U.S. Cl.
CPC ...... *H01L 27/10885* (2013.01); *H01L 23/5223* (2013.01); *H01L 27/10814* (2013.01); *H01L 27/10855* (2013.01)

USPC .... 257/306; 257/296; 257/307; 257/E27.088; 257/E27.094

(58) Field of Classification Search
CPC ................ H01L 23/5223; H01L 23/5226
USPC .......... 257/296, 306, 307, 308, 532, E27.034, 257/E27.084, E27.088, E27.089, E27.094
See application file for complete search history.

(56) References Cited

U.S. PATENT DOCUMENTS

| | | | | |
|---|---|---|---|---|
| 5,066,608 A | * | 11/1991 | Kim et al. | 438/244 |
| 6,060,353 A | * | 5/2000 | Koh | 438/253 |
| 6,228,711 B1 | * | 5/2001 | Hsieh | 438/255 |
| 6,383,866 B1 | * | 5/2002 | Mizukoshi et al. | 438/253 |
| 2001/0050436 A1 | * | 12/2001 | Sakao | 257/758 |
| 2002/0167036 A1 | * | 11/2002 | Hwang et al. | 257/296 |
| 2003/0178728 A1 | * | 9/2003 | Park et al. | 257/758 |
| 2004/0169217 A1 | * | 9/2004 | Houston | 257/296 |
| 2008/0283892 A1 | * | 11/2008 | Kang | 257/301 |

* cited by examiner

*Primary Examiner* — Eduardo A Rodela

(57) ABSTRACT

In a semiconductor device, a polysilicon layer of a lower electrode contact plug is removed by a strip process such that the deposition area of a dielectric film is increased and capacitance of a capacitor is assured. A method for manufacturing the semiconductor device is also disclosed.

7 Claims, 12 Drawing Sheets

Cell Array

SEMICONDUCTOR DEVICE AND METHOD FOR MANUFACTURING THE SAME

CROSS-REFERENCE TO RELATED APPLICATION

The priority of Korean patent application No. 10-2011-0065682 filed on 1 Jul. 2011, the disclosure of which is hereby incorporated in its entirety by reference, is claimed.

BACKGROUND OF THE INVENTION

Embodiments of the present invention relate to a semiconductor device in which a polysilicon layer of a lower electrode contact plug is removed by a strip process such that the deposition area of a dielectric film is increased and capacitance of a capacitor is guaranteed, and a method for manufacturing the same.

In case of a semiconductor device such as a Dynamic Random Access Memory (DRAM), it is necessary to reduce the area occupied by the semiconductor device in proportion to the increasing integration degree, and necessary electrostatic capacitance needs to be maintained or increased. Generally, there are a variety of methods to guarantee sufficient cell electrostatic capacitance within a limited area, for example, a method for using a high dielectric material as a dielectric film, a method for reducing a thickness of the dielectric film, a method for increasing an effective region of a lower electrode, etc. Specifically, the method for using the high dielectric material requires time and material investment, for example, the introduction of new equipments or installations, the necessity of verifying the reliability and productivity of a dielectric film, low-temperature processing of a subsequent process, etc. Accordingly, the method for increasing the effective region may offer a benefit in that a conventional dielectric film can be continuously used and the implementation of a fabrication process becomes relatively easier, so that it has been widely used in the actual fabrication process due to the above-mentioned advantages.

There are a variety of methods to increase an effective region of the lower electrode, for example, a method for configuring a lower electrode in the form of a three-dimensional (3D) structure (such as a cylinder or a fin), a method for growing a Hemi Spherical Grain (HSG) on a lower electrode, a method for increasing the height of a lower electrode, etc. Specifically, the method for growing the HSG may cause unexpected problems in guaranteeing Critical Dimension (CD) of at least predetermined level between lower electrodes, and may cause a bridge between lower electrodes due to infrequent HSG desquamation, so that it is difficult for the aforementioned HSG growing method to be applied to a semiconductor device based on the design rule of 0.14 μm or less. Therefore, in general, in order to increase cell electrostatic capacitance, a variety of methods for configuring a lower electrode in the form of a 3D structure and increasing the height of the lower electrode have been widely used. A representative example of such methods is a method for forming a cylindrical lower electrode or a stack-shaped lower electrode.

Specifically, the conventional method for forming the cylindrical lower electrode may remove a sacrificial insulation film from a peripheral part of the lower electrode, and deposit a dielectric film over the lower electrode. In this case, the dielectric material contained in the dielectric film is deposited not only over an inner wall of the lower electrode but also between neighbor lower electrodes, such that all the cells can share a dielectric material and an upper electrode formed over the dielectric material. Provided that the cells share and use such a dielectric material, capacitance (storage capacitance) among all the lower electrodes may be deteriorated or distorted.

As described above, in order to maximize cell capacitance for improving refresh characteristics of the conventional cylindrical lower electrode, the height of each lower electrode can be increased and the spacing between lower electrode contact plugs can be smaller. As a result, a bridge occurs between lower electrodes, making difficult to couple the lower electrode contact plug to the lower electrode.

BRIEF SUMMARY OF THE INVENTION

Various embodiments of the present invention are directed to providing a semiconductor device and a method for manufacturing the same that substantially obviate one or more problems due to limitations and disadvantages of the related art.

An embodiment of the present invention relates to a semiconductor device in which a polysilicon layer of a lower electrode contact plug is removed by a strip process such that the deposition area of a dielectric film is increased and capacitance of a capacitor is guaranteed, and a method for manufacturing the same.

In accordance with an aspect of the present invention, a method for forming a semiconductor device includes forming one or more bit line patterns over a semiconductor substrate; forming a lower electrode contact hole between the bit line patterns; forming a spacer material in the lower electrode contact hole; forming a lower electrode contact plug in the lower electrode contact hole; forming a sacrificial insulation film over the entire surface including the lower electrode contact plug; forming a lower electrode hole by etching the sacrificial insulation film until the lower electrode contact plug is exposed; removing the exposed lower electrode contact plug; etching back the spacer material; and after depositing a conductive material over the semiconductor substrate, the spacer material, and the sacrificial insulation film, forming a lower electrode by etching back the conductive material.

The formation of the lower electrode contact hole may include forming an insulation film over the bit line pattern and the semiconductor substrate; and etching the insulation film until the semiconductor substrate is exposed.

The spacer material may include a nitride film.

The formation of the lower electrode contact plug may include burying a polysilicon part into a lower electrode contact hole so as to form the lower electrode contact plug.

The removing of the exposed lower electrode contact plug until the spacer material is exposed may include removing a polysilicon of the lower electrode contact plug using a wet strip process.

The method may further include, after the formation of the lower electrode contact plug, forming an etch stop film between the lower electrode contact plug and the sacrificial insulation film.

The method may further include, after the formation of the sacrificial insulation film, forming a support layer for a nitride floating cap (NFC) over the sacrificial insulation film.

The method may further include, after the formation of the lower electrode, removing the sacrificial insulation film using a dip-out process.

In accordance with another aspect of the present invention, a semiconductor device includes one or more bit line patterns formed over a semiconductor substrate; one or more spacers formed between the bit line patterns; and a lower electrode formed over the semiconductor substrate between the spacers.

The semiconductor device may further include a dielectric film and an upper electrode formed over the lower electrode, wherein the dielectric film and the upper electrode are formed over only one surface of the lower electrode interposed between the spacers, and the dielectric film and the upper electrode are formed over both surfaces of the remaining lower electrode.

The lower electrode may be formed in a cylindrical or concave shape.

The method may further include a support layer pattern for supporting a part interposed between the lower electrodes.

The support layer pattern may include a nitride film.

The spacer may include a nitride film.

In accordance with another aspect of the present invention, a semiconductor device includes one or more bit line patterns formed over a semiconductor substrate including a plug; one or more spacers formed between the bit line patterns; and a lower electrode formed over the plug interposed between the spacers.

The semiconductor device may further include a dielectric film and an upper electrode formed over the lower electrode, wherein the dielectric film and the upper electrode are formed over only one surface of the lower electrode interposed between the spacers, and the dielectric film and the upper electrode are formed over both surfaces of the remaining lower electrode.

The lower electrode may be formed in a cylindrical or concave shape.

The semiconductor device may further include a support layer pattern for supporting a part interposed between the lower electrodes.

The spacer may include a nitride film.

The plug may include a polysilicon or metal material.

In accordance with another aspect of the present invention, a semiconductor device includes one or more bit line patterns formed over a semiconductor substrate including a plug; one or more spacers formed between the bit line patterns; a lower electrode formed over the plug interposed between the spacers; and a dielectric film and an upper electrode formed over the lower electrode, wherein the dielectric film and the upper electrode are formed over only one surface of the lower electrode interposed between the spacers, and the dielectric film and the upper electrode are formed over both surfaces of the remaining lower electrode.

The lower electrode may be formed in a cylindrical or concave shape.

The semiconductor device may further include a support layer pattern for supporting a part interposed between the lower electrodes.

The support layer pattern may include a nitride film.

The spacer may include a nitride film.

The plug may include a polysilicon or metal material.

In accordance with another aspect of the present invention, a unit cell includes one or more bit line patterns formed over a semiconductor substrate including a landing plug; one or more spacers formed between the bit line patterns; and a lower electrode formed over the landing plug interposed between the spacers.

In accordance with another aspect of the present invention, a cell array includes one or more bit line patterns formed over a semiconductor substrate including a landing plug; one or more spacers formed between the bit line patterns; and a lower electrode formed over the landing plug interposed between the spacers.

In accordance with another aspect of the present invention, a semiconductor device includes a plurality of cell arrays including a plurality of unit cells; a row decoder coupled to each cell array, a column decoder coupled to each cell array; and a sense amplifier for sensing data stored in a unit cell selected by the row decoder and the column decoder. The unit cell includes one or more bit line patterns formed over a semiconductor substrate including a landing plug; one or more spacers formed between the bit line patterns; and a lower electrode formed over the landing plug interposed between the spacers.

In accordance with another aspect of the present invention, a semiconductor module includes a plurality of semiconductor chips each including a plurality of unit cells; a command link coupled to the semiconductor chips so as to transmit/receive a command signal to and from the semiconductor chips; and a data link coupled to the semiconductor chips so as to transmit/receive data to and from the semiconductor chips. The unit cell includes one or more bit line patterns formed over a semiconductor substrate including a landing plug; one or more spacers formed between the bit line patterns; and a lower electrode formed over the landing plug interposed between the spacers.

In accordance with another aspect of the present invention, a semiconductor system includes a plurality of semiconductor modules each including a plurality of unit cells; a command link coupled to the semiconductor modules so as to transmit/receive a command signal to and from the semiconductor modules; a data link coupled to the semiconductor modules so as to transmit/receive data to and from the semiconductor modules; and a controller for controlling an interactive interface with an external system. The unit cell includes one or more bit line patterns formed over a semiconductor substrate including a landing plug; one or more spacers formed between the bit line patterns; and a lower electrode formed over the landing plug interposed between the spacers.

In accordance with another aspect of the present invention, an electronic unit includes a plurality of semiconductor systems each including a unit cell, and a processor coupled to the semiconductor systems. The unit cell includes one or more bit line patterns formed over a semiconductor substrate including a landing plug; one or more spacers formed between the bit line patterns; and a lower electrode formed over the landing plug interposed between the spacers.

In accordance with another aspect of the present invention, an electronic system includes an electronic unit including a plurality of unit cells, and one or more interfaces coupled to the electronic unit. The unit cell includes one or more bit line patterns formed over a semiconductor substrate including a landing plug; one or more spacers formed between the bit line patterns; and a lower electrode formed over the landing plug interposed between the spacers.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

FIGS. 1*a* to 1*h* are cross-sectional views illustrating a method for manufacturing a semiconductor device according to an embodiment of the present invention.

Figure 1A:
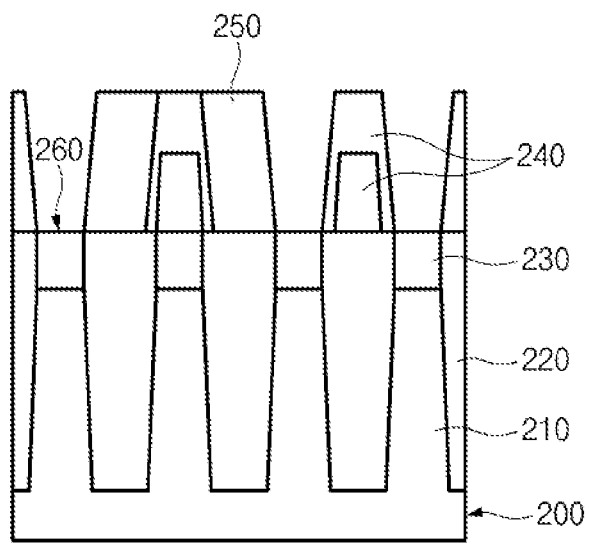
FIGS. 1a to 1h are cross-sectional views illustrating a method for manufacturing a semiconductor device according to embodiments of the present invention.

Referring to FIG. 1*a*, a device isolation film 220 defining an active region 210 is formed over a semiconductor substrate 200.

Ion implantation is performed upon the top part of the active region 210 so as to form a landing plug polysilicon layer (or source/drain region) 230.

Subsequently, a bit line pattern 240 is formed over the landing plug polysilicon layer 230 and the semiconductor substrate 200. In this case, the bit line pattern 240 may be formed of a bit line metal layer and a hard mask layer. Preferably, the bit line metal layer may include tungsten (W) and the hard mask layer may include a nitride film.

An interlayer insulation film 250 is formed over the bit line pattern 240 and the semiconductor substrate 200. In this case, the interlayer insulation film 250 may include an oxide film.

After a photoresist film (not shown) is formed over the interlayer insulation film 250, a photoresist pattern (not shown) is formed using an exposure and development process that utilizes a mask for forming a lower electrode contact plug. The interlayer insulation film 250 is etched until the landing plug polysilicon layer 230 is exposed using the photoresist pattern as an etch mask, such that a lower electrode contact hole 260 is formed.

Figure 1B:
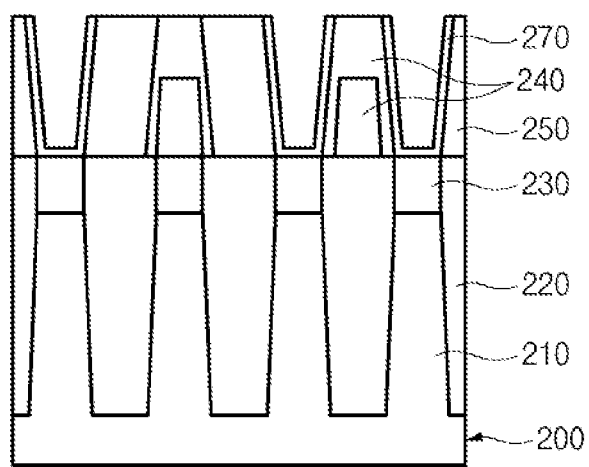

Referring to FIG. 1*b*, a spacer material 270 is deposited in the lower electrode contact hole 260. In this case, the spacer material 270 may include a nitride film.

Figure 1C:
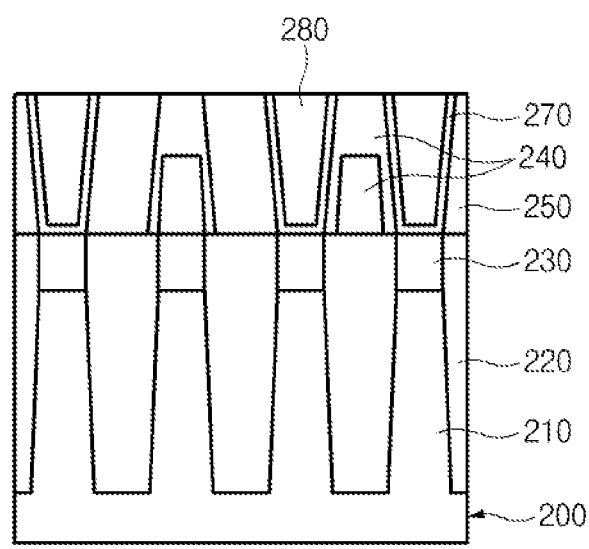

Referring to FIG. 1*c*, after a conductive material is deposited over the entire surface including the lower electrode contact plug 260, the conductive material is planarized using a Chemical Mechanical Polishing (CMP) process until the bit line pattern 240 is exposed, such that the lower electrode contact plug 280 is formed.

Figure 1D:
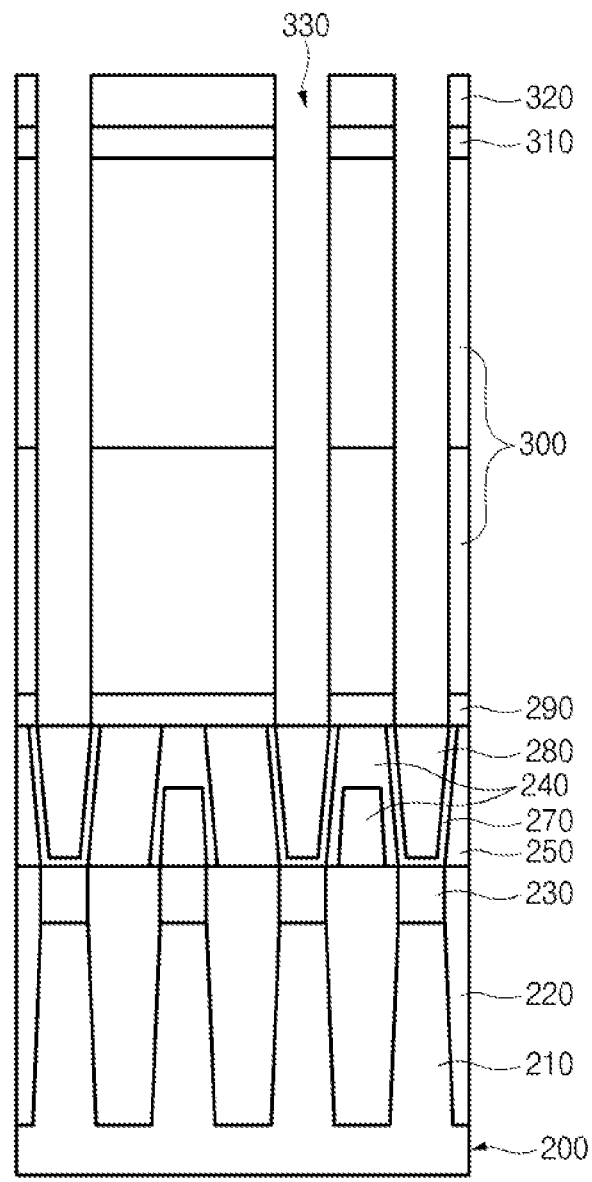

Referring to FIG. 1*d*, an etch stop layer 290 is formed over the lower electrode contact plug 280. Preferably, the etch stop layer 290 may include a nitride film. In addition, a first sacrificial insulation film 300 is formed over the etch stop layer 290. In this case, the first sacrificial insulation film 300 may be configured in a laminate structure of a PhospoSilicate Glass (PSG) film and a Tetraethly Orthosilicate (TEOS) film.

A support layer 310 for a nitride floating cap and a second sacrificial insulation film are formed over the first sacrificial insulation film 300.

Subsequently, after a photoresist film is formed over the second sacrificial insulation film 320, a photoresist pattern (not shown) is formed using an exposure and development process utilizing a lower electrode mask. The second sacrificial insulation film 320, the NFC support layer 310, the first sacrificial insulation film 300, and the etch stop layer 290 are etched using the photoresist pattern as an etch mask, such that a lower electrode hole 330 is formed.

Figure 1E:
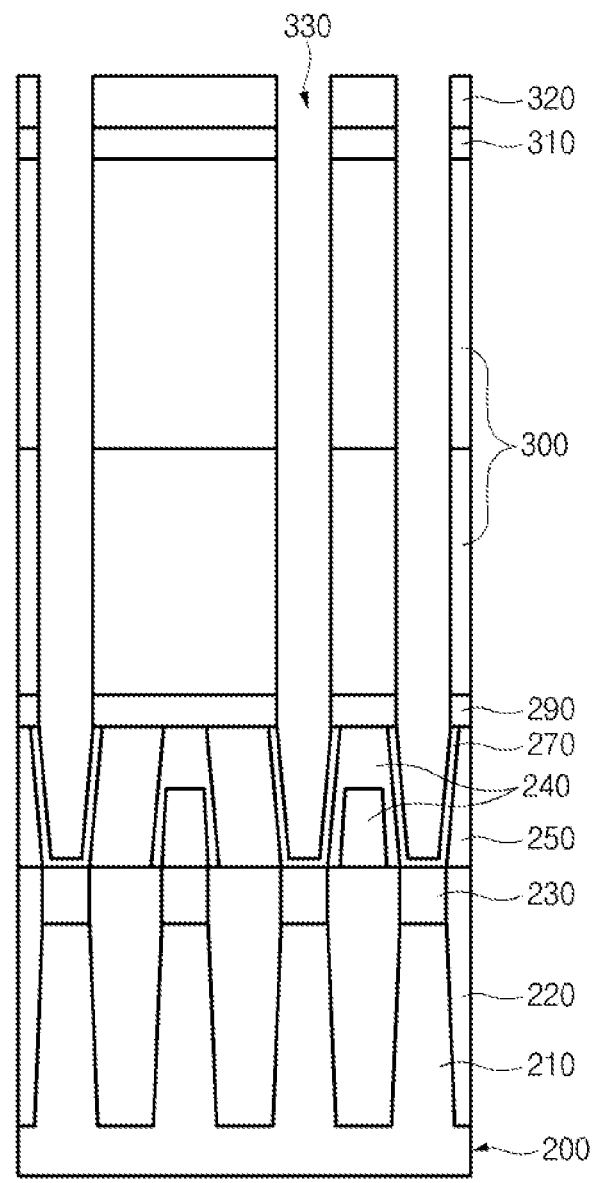

Referring to FIG. 1*e*, the exposed lower electrode contact plug 280 is removed by a strip process. so that, in a subsequent step a lower electrode may be directly coupled to the source/drain region (230) without any pattern interposed therebetween.

In an alternative embodiment, the lower electrode contact plug 280 may only be partially removed. Thus, in a subsequent step, the lower electrode may be coupled to the source/drain region (230) through the remaining electrode contact plug. In such an embodiment, the thickness of the remaining contact plug may be adjusted so that a bottom of the lower electrode (340) will be located at a lower level than a top of the bit line pattern (240)

Figure 1F:
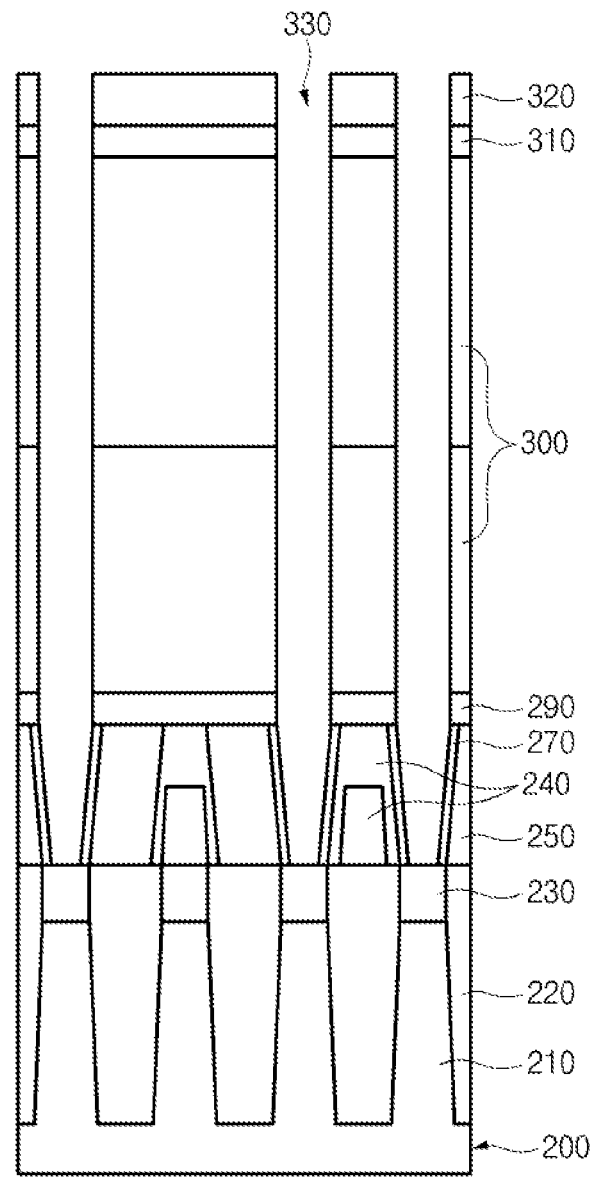

Referring to FIG. 1*f*, a spacer material 270 deposited over the bottom area of a lower electrode contact hole 260 is removed.

Figure 1G:
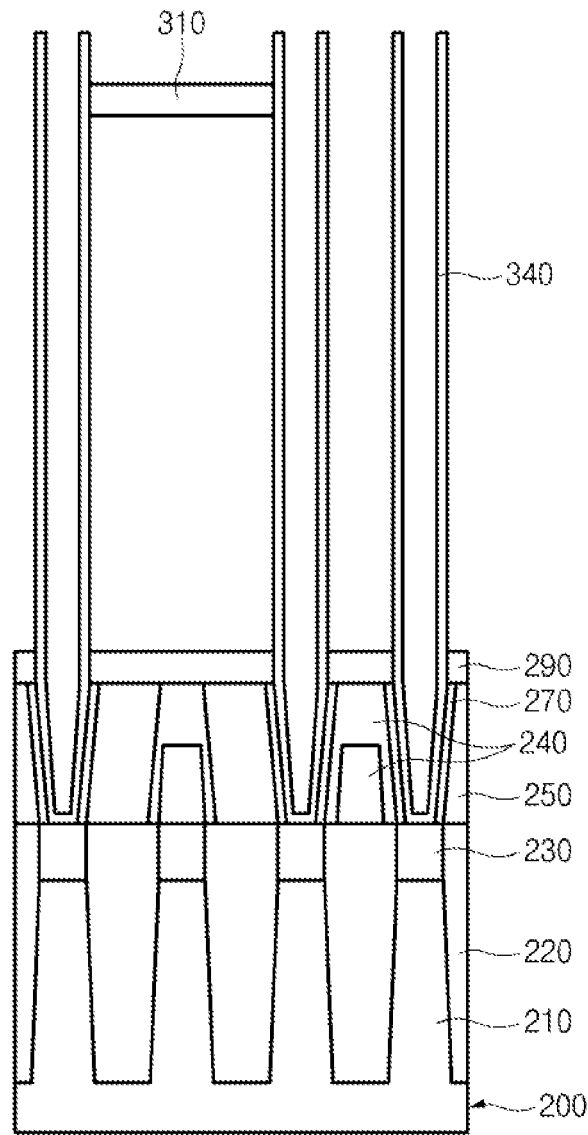

Referring to FIG. 1*g*, after a conductive material is formed over the lower electrode contact hole 260 and the lower electrode hole 330, the conductive material is etched back such that the lower electrode 340 is formed. In this case, the conductive material may be formed in a laminate structure of a titanium (Ti) film and a titanium nitride film (TiN) film. The titanium (Ti) film may be formed to have a thickness of about 50~100, and the titanium nitride (TiN) film may be formed to have a thickness of about 200~300.

In addition, the second sacrificial insulation film 320 and the first sacrificial insulation film 300 are removed using the dip-out process. a semiconductor device according to the present invention includes a lower electrode 340 substantially directly coupled to a first source/drain region 230 in a substrate. Bit line patterns 240 are coupled to second source/drain regions 230, respectively. The lower electrode 340 extends between the bit line patterns 240 so that a bottom of the lower electrode 340 is located at a lower level than a top of the bit line pattern 240. The lower electrode 340 includes an upper portion in a cylinder structure and a lower portion in a concave structure.

Figure 1H:
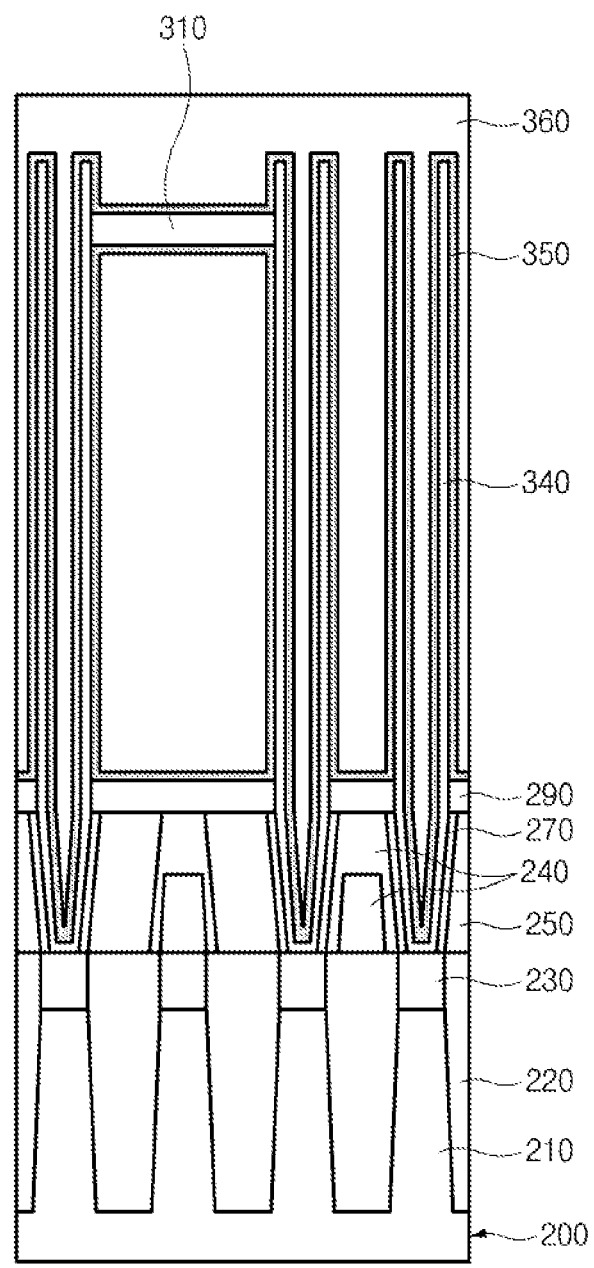

Referring to FIG. 1*h*, a dielectric film 350 and an upper electrode 360 are sequentially formed over the lower electrode, resulting in capacitor formation.

Figure 2:
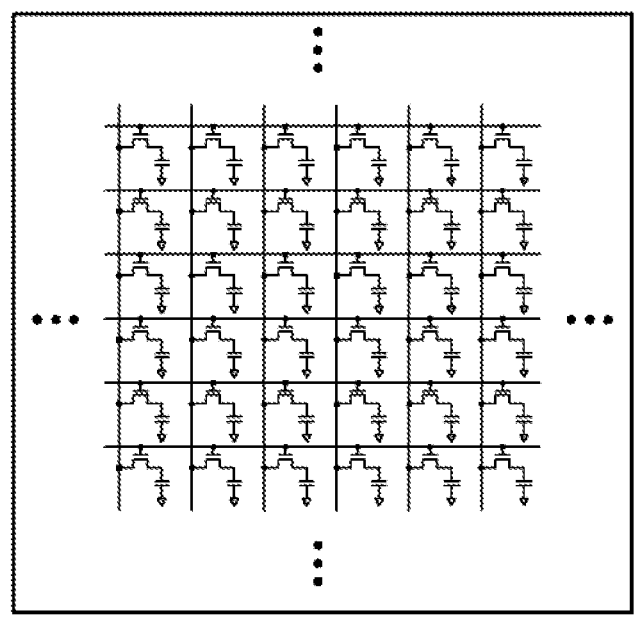
FIG. 2 is a block diagram illustrating a cell array according to an embodiment of the present invention.

FIG. 2 is a block diagram illustrating a cell array according to the present invention.

Referring to FIG. 2, the cell array includes a plurality of memory cells, and each memory cell includes one transistor and one capacitor. Such memory cells are located at intersections of bit lines BL1 BLn and word lines WL1 WLm. The memory cells may store or output data in response to a voltage applied to any bit line (BL1, . . . , BLn) or any word line (WL1, . . . , WLm) selected by a column decoder and a row decoder.

As can be seen from FIG. 2, a first direction (i.e., a bit-line direction) of the bit lines (BL1, . . . , BLn) of the cell array is the longitudinal direction, and a second direction (i.e., a word-line direction) of the word lines (WL1, . . . , WLm) is orthogonal to the longitudinal direction, such that the bit lines (BL1, . . . , BLn) cross the word lines (WL1, . . . , WLm).

A first terminal (for example, a drain terminal) of a transistor is coupled to the bit lines (BL1, . . . , BLn), a second terminal (for example, a source terminal) thereof is coupled to a capacitor, and a third terminal thereof (for example, a gate terminal) is coupled to the word lines (WL1, . . . , WLm). A plurality of memory cells including the bit lines (BL1, . . . , BLn) and the word lines (WL1, . . . , WLm) may be located in a semiconductor cell array.

Figure 3:
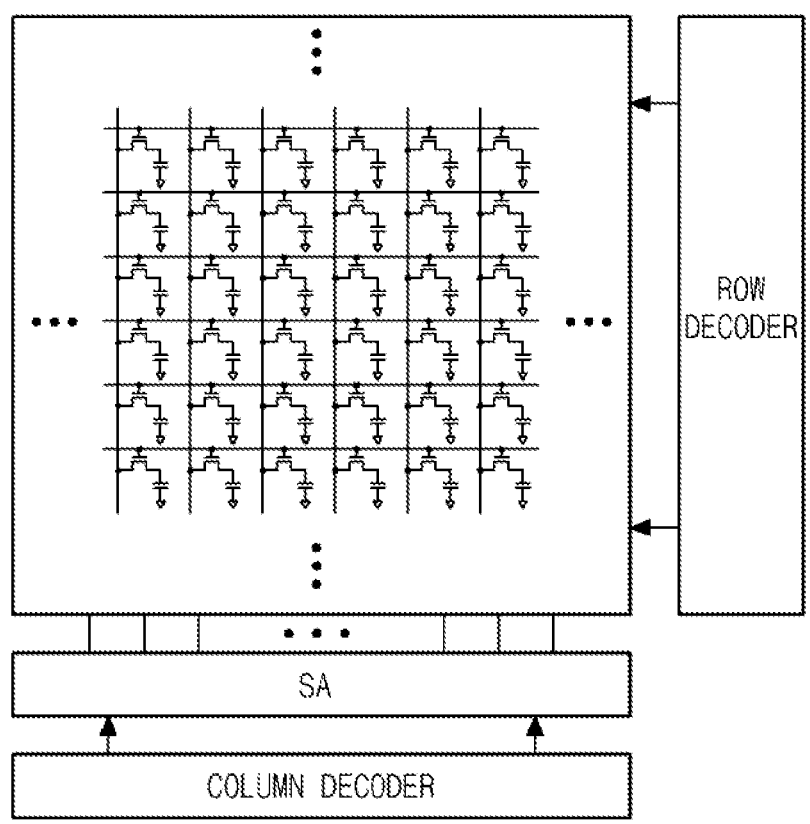
FIG. 3 is a block diagram illustrating a semiconductor device according to an embodiment of the present invention.

FIG. 3 is a block diagram illustrating a semiconductor device according to an embodiment of the present invention.

Referring to FIG. 3, the semiconductor device may include a cell array, a row decoder, a column decoder, and a sense amplifier (SA). The row decoder selects a word line corresponding to a memory cell in which a read or write operation is to be performed from among a plurality of word lines of the semiconductor cell array, and outputs a word-line selection signal (RS) to the semiconductor cell array. In addition, the column decoder selects a bit line corresponding to a memory cell in which a read or write operation is to be performed from among a plurality of bit lines of the semiconductor cell array, and outputs a bit-line selection signal (CS) to the semiconductor cell array. In addition, the sense-amplifier (SA) may sense data (BDS) stored in a memory cell selected by the row decoder and column decoder.

The semiconductor device may be coupled to a microprocessor or a memory controller. The semiconductor device may receive control signals such as WE*, RAS* and CAS* from the microprocessor, may receive data through an input/output (I/O) circuit, and may store the received data.

The semiconductor device may be applied to a Dynamic Random Access Memory (DRAM), a P-Random Access Memory (P-RAM), an M-Random Access Memory (M-RAM), a NAND flash memory, a CMOS Image Sensor (CIS), and the like. Specifically, the semiconductor device may be applied to a desktop, a laptop, or a server, and may also be applicable to a graphics memory and a mobile memory. The NAND flash memory is applicable not only to a variety of portable storage media (for example, a memory stick, a multimedia card (MMC), a secure digital (SD) card a compact flash (CF) card, an eXtreme Digital (XD) card, a universal serial bus (USB) flash drive, etc.), but also to a variety of digital applications (for example, MP3 players, PMPs, digital cameras, camcorders, memory cards, USB, game machines, navigation devices, laptops, desktop computers, mobile phones, and the like). The CMOS Image Sensor (CIS) is a charge coupled device (CCD) serving as an electronic film in digital devices, and is applicable to camera phones, Web cameras, small-sized medical imaging devices, etc.

Figure 4:
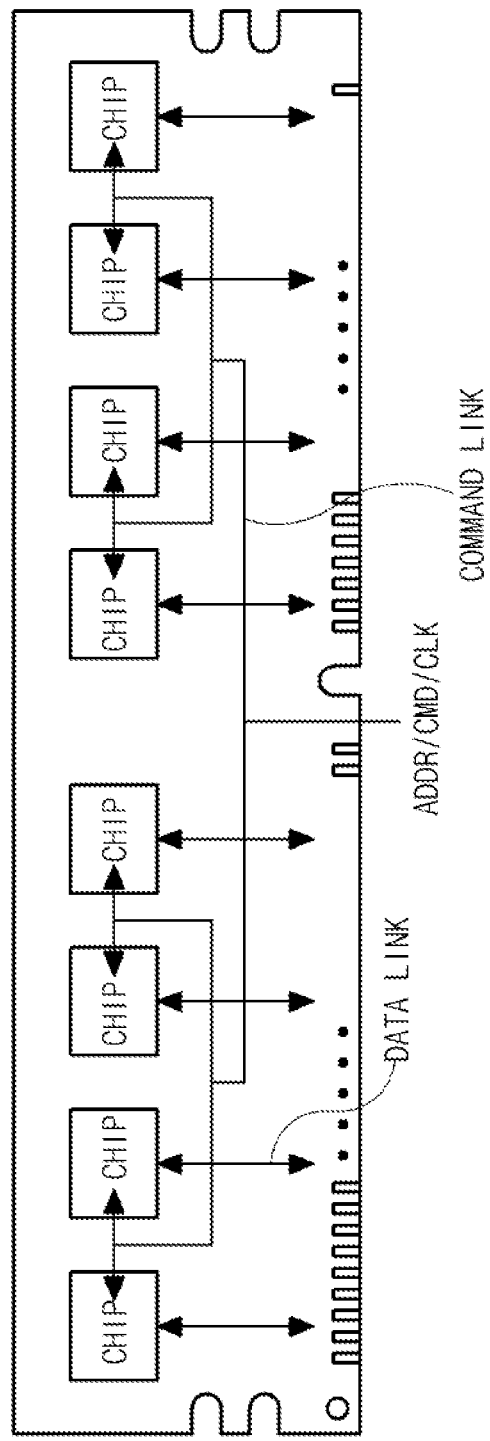
FIG. 4 is a block diagram illustrating a semiconductor module according to an embodiment of the present invention.

FIG. 4 is a block diagram illustrating a semiconductor module according to the present invention.

Referring to FIG. 4, a semiconductor module includes a plurality of semiconductor devices mounted to a module substrate, a command link allowing each semiconductor device to receive a control signal (address signal (ADDR)), a command signal (CMD), and a clock signal (CLK) from an external controller (not shown), and a data link coupled to a semiconductor device so as to transmit data.

In this case, the semiconductor device may correspond to the semiconductor devices disclosed in FIG. 3. In addition, the command link and the data link may be formed to be identical or similar to those of general semiconductor modules.

Although eight semiconductor chips are mounted to the front surface of the particular module substrate shown in FIG. 4, it should be noted that the semiconductor chips can also be mounted to the back surface of the module substrate. That is, the semiconductor chips can be mounted to one side or both sides of the module substrate, and the number of mounted semiconductor chips is not limited to the example of FIG. 4. In addition, a material or structure of the module substrate is not limited to those of FIG. 4, and the module substrate may also be formed of other materials or structures.

Figure 5:
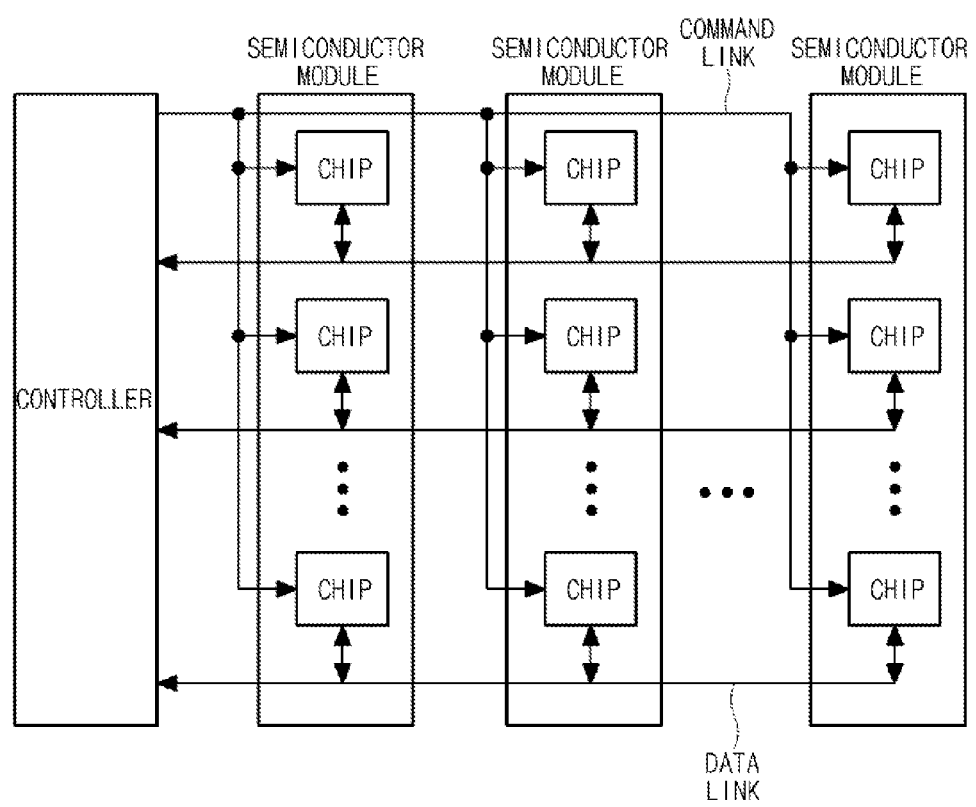
FIG. 5 is a block diagram illustrating a semiconductor system according to an embodiment of the present invention.

FIG. 5 is a block diagram illustrating a semiconductor system according to an embodiment of the present invention.

Referring to FIG. 5, a semiconductor system includes at least one semiconductor module including a plurality of semiconductor chips, and a controller for providing a bidirectional interface between each semiconductor module and an external system (not shown) so as to control the operations of the semiconductor module.

The controller may be identical or similar in function to a controller for controlling a plurality of semiconductor modules for use in a general data processing system, and as such a detailed description thereof will be omitted herein for convenience of description. In this case, the semiconductor module may be, for example, a semiconductor module shown in FIG. 4.

Figure 6:
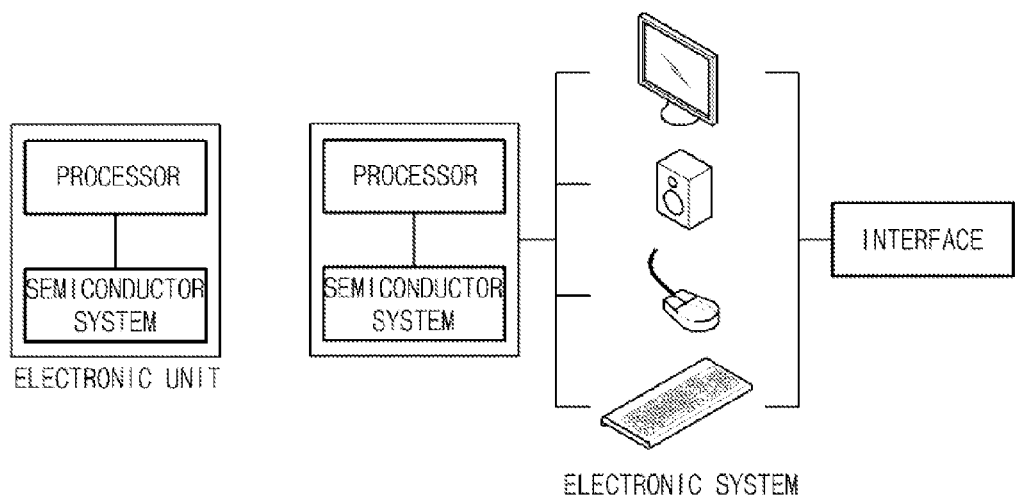
FIG. 6 is a block diagram illustrating an electronic unit according to an embodiment.

FIG. 6 is a block diagram illustrating an electronic unit and an electronic system according to embodiments of the present invention.

Referring to the left drawing of FIG. 6, the electronic unit according to an embodiment of the present invention includes an electronic unit and a processor electrically coupled to the electronic unit. In this case, the semiconductor system of FIG. 6 is identical to that of FIG. 5. In this case, the processor may include a Central Processing Unit (CPU), a Micro Processor Unit (MPU), a Micro Controller Unit (MCU), a Graphics Processing Unit (GPU), and a Digital Signal Processor (DSP).

In this case, the CPU or MPU may be configured in the form of a combination of an Arithmetic Logic Unit (ALU) serving as an arithmetic and logical operation unit and a Control Unit (CU) for controlling each unit by reading and interpreting a command. If the processor is a CPU or MPU, the electronic unit may include a computer or a mobile device.

In addition, the GPU may be used to calculate numbers having decimal points, and corresponds to a process for generating graphical data in real-time. If the processor is a GPU, the electronic unit may include a graphic device.

In addition, DSP involves converting an analog signal (e.g., voice signal) into a digital signal at high speed, using the calculated result, re-converting the digital signal into an analog signal, and using the re-converted result. The DSP mainly calculates a digital value. If the processor is a DSP, the electronic unit may include a sound and imaging device.

The processor may include an Accelerate Calculation Unit (ACU), and is configured in the form of a CPU integrated into the GPU, such that it serves as a graphics card.

Referring to the right drawing of FIG. 6, the electronic system may include one or more interfaces electrically coupled to the electronic unit. In this case, the electronic unit is identical to that of FIG. 6. In this case, the interface may include a monitor, a keyboard, a printer, a pointing device (mouse), a USB, a switch, a card reader, a keypad, a dispenser, a phone, a display or a speaker. However, it should be noted that the scope of the interface is not limited thereto and is also applicable to other examples.

As is apparent from the above description, the semiconductor device and the method for forming the same according to the embodiments of the present invention may offer certain benefits. For example, in the semiconductor device, a polysilicon layer of a lower electrode contact plug is completely or partially removed such that a surface area of a dielectric film can be effectively increased and thus capacitance of a capacitor is improved.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
bit lines formed over a semiconductor substrate;
spacers formed at sidewalls of the bit lines;
a lower electrode including an upper portion with a cylinder structure and a lower portion with a concave structure formed over a plug exposed between the spacers; and
a dielectric film and an upper electrode formed over the lower electrode,
wherein the dielectric film and the upper electrode are formed over only an inner side of the lower electrode at a first region where one of the spacers is formed over an outer side of the lower electrode,
wherein the dielectric film and the upper electrode are formed over opposing sides of the upper portion of the lower electrode,
wherein the bit lines are disposed beside the lower portion of the lower electrode and below the upper portion of the lower electrode, and
wherein top surfaces of the bit lines are at or below a transition between the upper portion of the lower electrode and the lower portion of the lower electrode.

2. The semiconductor device according to claim 1, the device further comprising:
a support layer pattern for supporting the lower electrode.

3. The semiconductor device according to claim 2, wherein the support layer pattern includes a nitride film.

4. The semiconductor device according to claim 1, wherein each of the spacers includes a nitride film.

5. The semiconductor device according to claim 1, wherein the plug includes polysilicon or metal material.

6. The semiconductor device of claim 1, wherein the bit lines are each coupled to second source/drain regions, wherein the lower electrode extends between the bit lines.

7. The semiconductor device according to claim 1, wherein the lower electrode extends between the bit lines.

* * * * *